United States Patent [19]
Lee et al.

[11] Patent Number: 5,963,501
[45] Date of Patent: Oct. 5, 1999

[54] DYNAMIC CLOCK SIGNAL GENERATING CIRCUIT FOR USE IN SYNCHRONOUS DYNAMIC RANDOM ACCESS MEMORY DEVICES

[75] Inventors: Sung-geun Lee, Kyungki-do; Woo-seop Jeong, Suwon, both of Rep. of Korea

[73] Assignee: Samsung Electronics, Coi., Ltd., Suwon, Rep. of Korea

[21] Appl. No.: 09/096,447

[22] Filed: Jun. 11, 1998

[30] Foreign Application Priority Data

Jun. 11, 1997 [KR] Rep. of Korea ................. 97-24088

[51] Int. Cl.$^6$ ........................................... G11C 8/00
[52] U.S. Cl. .............. 365/233; 365/233.5; 365/230.08
[58] Field of Search ............................. 365/233, 233.5, 365/230.08, 194

[56] References Cited

U.S. PATENT DOCUMENTS 5,703,828  12/1997  Park et al. .................... 365/233.5
5,815,462   9/1998  Konishi et al. ................ 365/233

Primary Examiner—Huan Hoang
Attorney, Agent, or Firm—Marger Johnson & McCollom, P.C.

[57] ABSTRACT

A clock signal generating circuit for use in a synchronous dynamic random access memory device. The clock signal generating circuit includes an input buffer for converting an externally supplied system clock signal having a first voltage level into a clock signal having a voltage level necessary for operating with the internal circuitry of the memory device. An enable path circuit generates a second transition of an internal clock signal which occurs substantially simultaneous the second transition of the system clock signal. The enable path circuit generates the first transition of the internal clock signal after the internal clock signal is maintained at the second state for a predetermined interval responsive to first and second disable signals. Finally, a disable path circuit receives the clock signal generated from the input buffer and supplies the first and second disable signals to the enable path circuit.

22 Claims, 2 Drawing Sheets

DYNAMIC CLOCK SIGNAL GENERATING CIRCUIT FOR USE IN SYNCHRONOUS DYNAMIC RANDOM ACCESS MEMORY DEVICES

BACKGROUND OF THE INVENTION

1. Field of the Invention

The present invention relates to a semiconductor memory device and, more particularly, to a dynamic clock signal generating circuit for use in a synchronous Dynamic Random Access Memory (DRAM) device.

2. Description of the Related Art

Typically, DRAM devices are asynchronously controlled by a control device such as a microprocessor. The microprocessor provides an address to DRAM input terminals and strobes the address by using row and column address strobe signals. The address is held valid for a required minimum time. During the time the address is held valid, the DRAM device accesses the addressed cells. Thereafter, the DRAM writes new data from the microprocessor to selected memory cells or provides the data from selected memory cells to its output terminal for the microprocessor to read the data. The processor is in a standby state while the DRAM performs various internal operations, such as precharge, address decoding, data sensing, data output through an output buffer, and the like. Because the microprocessor is essentially idle during the standby state, the system operating speed is adversely affected. DRAM devices which free up the microprocessor to perform other tasks during the standby period and speed up the input and output of data have been recently developed.

Synchronous DRAM typically includes a clock signal buffer for converting a system clock signal typically supplied by the processor into a level suitable for internal circuitry. By utilizing the clock signal buffer, each circuit within the memory device operates responsive to the system clock signal. However, since the clock signal buffer generates the internal clock signal by buffering the externally supplied system clock signal, a time delay between the external system clock signal and the internal clock signal is inevitably generated due to the delay of the buffer. If the external and internal clock signals are skewed, the internal operation of the device when the external clock signal is supplied is delayed. Accordingly, a need exists for a clock signal generating circuit which generates an internal clock signal with a minimized delay with respect to the external system clock signal.

SUMMARY OF THE INVENTION

An object of the present invention is to provide a dynamic clock signal generating circuit for use in a synchronous DRAM device which can generate an internal clock signal having a minimum delay with respect to a system clock signal.

Another object of the present invention is to provide a dynamic clock signal generating circuit for use in a synchronous DRAM device which has a relatively simple circuit construction.

The present invention includes a clock signal generating circuit for use in a synchronous dynamic random access memory. In one embodiment, the clock signal generating circuit includes an input buffer for converting an externally provided system clock signal into an internal clock signal having a predetermined voltage level necessary for proper operation in internal circuitry. An enable path circuit generates a second transition of the internal clock signal. The second transition of the internal clock signal occurs substantially simultaneous the second transition of the system clock signal. The enable path circuit also generates the first transition of the internal clock signal after the internal clock signal is maintained at the second state for a predetermined interval responsive to first and second disable signals. Finally, a disable path circuit receives the input buffer clock signal and supplies the first and second disable signals to the enable path circuit.

The foregoing and other objects, features and advantages of the invention will become more readily apparent from the following detailed description of a preferred embodiment of the invention which proceeds with reference to the accompanying drawings.

DETAILED DESCRIPTION OF THE PREFERRED EMBODIMENT

Figure 1:
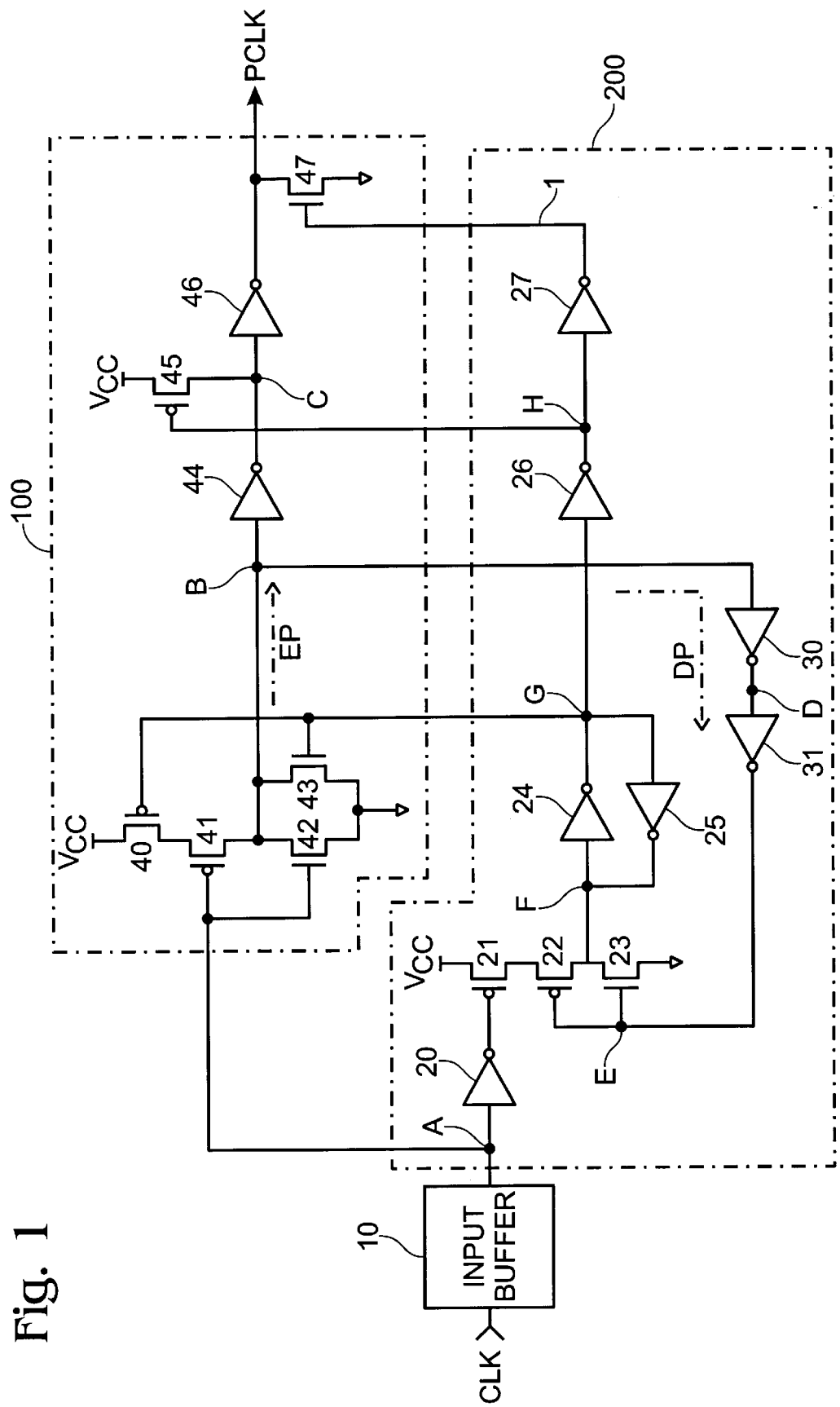
FIG. 1 is a circuit diagram of a dynamic clock signal generating circuit for use in a synchronous DRAM device according to the present invention.

FIG. 1 shows a dynamic clock signal generating circuit for use in a synchronous DRAM device according to the present invention. The clock signal generating circuit generates an internal clock signal PCLK with a minimum delay with respect to the system clock signal CLK. The clock signal generating circuit includes an input buffer 10, an enable path circuit 100, and a disable path circuit 200. The input buffer 10 converts the system clock signal CLK into a clock signal having a voltage level necessary for operating with the internal circuitry. For example, if the system clock signal CLK has a Transistor-Transistor Logic (TTL) voltage level and the internal circuitry operates using Complementary Metal Oxide Semiconductor (CMOS) voltage levels, input buffer 10 converts the system clock signal CLK from a TTL voltage level into a clock signal having a CMOS voltage level.

The enable path circuit 100 consists of PMOS transistors 40, 41, and 45, NMOS transistors 42, 43, and 47, and inverters 44 and 46. The disable path circuit 200 consists of PMOS transistors 21 and 22, an NMOS transistor 23, and inverters 20, 24–27, and 30–31.

In the enable path circuit 100, PMOS transistor 41 and NMOS transistor 42 and PMOS transistor 40 and NMOS transistor 43 each form an inverter. In the disable path circuit 200, PMOS transistor 22 and NMOS transistor 23 also form an inverter. Inverters 30 and 31 form a delay chain. The amount of delay of inverters 30 and 31 determine the pulse width of the internal clock signal PCLK. The inverters 24 and 25 constitute a latch. Each inverter substantially consists of a pair of PMOS and NMOS transistors. To improve operating speed, the gate length of the PMOS transistor within inverter 46 is preferably 180 $\mu$m which is longer than the typical NMOS gate length. Moreover, the gate length of an NMOS transistor within the inverter 44 is preferably 50 $\mu$m which is longer than the typical gate length of about 10 $\mu$m. The gate lengths of PMOS transistors 40 and 41 are preferably about 60 $\mu$m and 40 $\mu$m, respectively.

The enable path circuit 100 generates a second transition (for example, a rising edge) of the internal clock signal PCLK which tracks, at high speed, the second transition (from a logic "LOW" to a logic "HIGH" level) of the system clock signal CLK. In other words, the second transition of the internal clock signal PCLK occurs substantially simultaneous the second transition of the system clock CLK. Further, the enable path circuit 100 maintains the second transition of the internal clock signal PCLK for a predetermined interval responsive to the first and second disable signals. The first and second disable signals correspond to waveforms H and I shown in FIG. 2. The enable path circuit 100 then generates the first transition (a falling edge) of the internal clock signal PCLK. In one example, the internal PCLK signal has the shape of a pulse in which the logic "HIGH" level interval is relatively shorter than the logic "LOW" level interval.

The disable path circuit 200 receives the input buffer clock signal at a node A of the input buffer 10 and supplies the first and second disable signals to enable path circuit 100. The first and second disable signals correspond to waveforms H and I shown in FIG. 2. Reference symbols EP and DP designate the enable path and the disable path, respectively.

Figure 2:
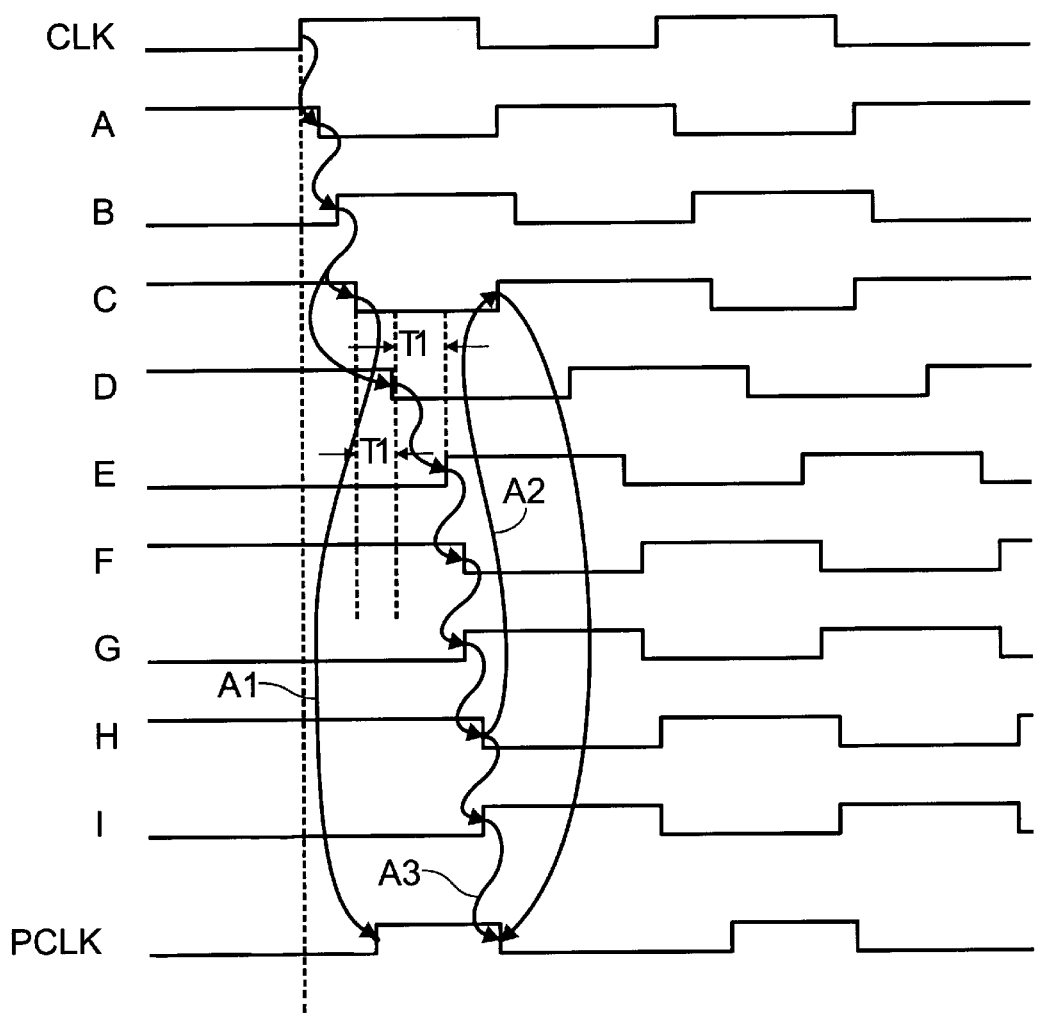
FIG. 2 is an operational timing chart of the signals shown in FIG. 1.

FIG. 2 is an operational timing chart of signals appearing at each node indicated in FIG. 1. Referring to FIG. 2, the clock signal generating circuit of FIG. 1 generates the internal clock signal PCLK having a predetermined pulse width with a minimum delay with respect to the system clock signal CLK. The waveforms indicated by reference symbols designate waveforms appearing at each node indicated by like symbols in FIG. 1. If the system clock signal CLK changes to a logic "HIGH" level from a logic "LOW" level, waveform A appears at node A by the buffering and inverting operation of input buffer 10. Waveform B is the inverse of waveform A having been inverted by the inverter formed by transistors 41–43. The inverter 30 delays the waveform B by an interval T1 and generates a waveform D at node D. The waveform D is again delayed by an interval T2 by inverter 31 and appears as waveform E at node E. If the transistor 45 is turned on by the falling edge of waveform H, a waveform C appears at node C. If the waveform C passes through inverter 46, the internal clock signal PCLK is generated. In FIG. 2, an arrow A2 shows the rising edge of waveform C responsive to the waveform H. Meanwhile, the falling edge of the waveform C is generated in parallel by enable path circuit 100 responsive to waveform B. As indicated by arrows A1–A3, the circuit of FIG. 1 generates an internal clock signal PCLK having a predetermined pulse width with a minimum delay with respect to the system clock signal CLK. Since the gate delay during enabling is generated only by input buffer 10, transistor 40, and inverters 44 and 46, there are only 4 total gate delays.

As described above, the dynamic clock signal generating circuit for use in the synchronous DRAM can generate an internal clock signal having a predetermined pulse width with a minimum delay with respect to the system clock signal.

Having described and illustrated the principles of the invention in a preferred embodiment thereof, it should be apparent that the invention can be modified in arrangement and detail without departing from such principles. I claim all modifications and variation coming within the spirit and scope of the following claims.

What is claimed is:

1. A clock signal generating circuit for generating an internal clock signal for a synchronous DRAM device, comprising:

an input buffer for converting an externally received system clock signal operating within a first voltage range to a buffered system clock signal operating within a second voltage range, the second voltage range corresponding to a voltage range of DRAM internal circuitry;

a disable path circuit for generating first and second disable signals responsive to the buffered system clock signal; and an enable path circuit for generating a first transition of the internal clock signal responsive to the buffered system clock signal and a second transition of the internal clock signal responsive to the first and second disable signals, the first transition of the internal clock signal occurring substantially simultaneous a first transition of the system clock signal.

2. The clock signal generating circuit of claim 1 wherein the first transition of the internal clock signal is from a logic low level to a logic high level, the second transition of the internal clock signal is from a logic high level to a logic low level, and the first transition of the system clock signal is from a logic low level to a logic high level.

3. The clock signal generating circuit of claim 1 wherein the first transition of the internal clock signal is from a logic high to a logic low level, the second transition of the internal clock signal is from a logic low to a logic high level, and the first transition of the system clock signal if from a logic high level to a logic low level.

4. The clock signal generating circuit of claim 1 wherein the enable path circuit includes a PMOS and an NMOS transistor, the PMOS transistor having a gate coupled to the first disable signal and the NMOS transistor having a gate coupled to the second disable signal.

5. The clock signal generating circuit of claim 1 wherein the disable path circuit includes a delay chain.

6. The clock signal generating circuit of claim 5 wherein the delay chain includes at least two serially connected inverters.

7. The clock signal generating circuit of claim 5 wherein the delay chain maintains the internal clock signal at a first logic state for a predetermined time.

8. The clock signal generating circuit of claim 1 wherein the disable path circuit includes a latch.

9. The clock signal generating circuit of claim 8 wherein the latch includes two inverters.

10. A clock signal generating circuit for generating an internal clock signal for a synchronous DRAM device, comprising:

an input buffer for converting a system clock signal having a first voltage level into a buffered system clock signal having a second voltage level;

a disable signal generating circuit for generating first and second disable signals responsive to a first transition of the buffered system clock signal; and an internal clock signal enabling circuit for generating a first transition of the internal clock signal responsive to the first transition of the buffered system clock signal and a second transition of the internal clock signal responsive to the first and second disable signals.

11. The clock signal generating circuit of claim 10 wherein the disable signal generating circuit includes a delay chain.

12. The clock signal generating circuit of claim 11 wherein the delay chain includes at least two serially connected inverters.

13. The clock signal generating circuit of claim 11 wherein the delay chain includes a delay which determines a pulse duration of the internal clock signal.

14. The clock signal generating circuit of claim 11 wherein the disable signal generating circuit includes a latch.

15. The clock signal generating circuit of claim 13 wherein the latch includes two inverters.

16. The clock signal generating circuit of claim 10 wherein the internal clock signal enabling circuit includes a first and a second transistors, the first transistor being responsive to the first disable signal and the second transistor being responsive to the second disable signal.

17. A method for generating an internal clock signal for a synchronous DRAM device, the internal clock signal having a first edge, a second edge, and a predetermined pulse duration for defining an internal clock signal pulse, the first edge occurring substantially simultaneous a first edge of an external system clock signal, the method comprising:

converting the external system clock signal having a first voltage level to a converted system clock signal having a second voltage level, the second voltage level corresponding to an internal operating voltage level of the DRAM;

delaying the converted system clock signal to form the delayed system clock signal; and forming the second edge of the internal clock signal responsive to the delayed system clock signal.

18. The method for generating an internal clock signal of claim 17 including:

latching the delayed system clock signal to form the latched system clock signal; and enabling a transistor responsive to the latched system clock signal thereby generating the second edge of the internal clock signal.

19. The method for generating an internal clock signal of claim 17 wherein delaying the converted system clock signal includes delaying the converted system clock signal by the predetermined pulse duration.

20. The method for generating an internal clock signal of claim 17 including inverting the converted system clock signal.

21. The method for generating an internal clock signal of claim 17 wherein enabling a transistor includes driving a node to a first power supply level responsive to the latched system clock signal.

22. A clock signal generating circuit for generating an internal clock signal for a synchronous DRAM device, comprising:

an input buffer for converting a system clock signal having a first voltage level into a buffered system clock signal having a second voltage level;

a first inverter circuit coupled to the input buffer for generating a first inverter circuit clock signal by inverting the buffered system clock signal;

a first inverter coupled to the first inverter circuit for generating a first inverter clock signal by inverting the first inverter circuit clock signal and providing the first inverter clock signal to a first node;

a second inverter coupled to the first inverter for generating a first transition of the internal clock signal by inverting the first inverter clock signal and providing the internal clock signal to a second node;

a third inverter coupled to the input buffer for generating a third inverter clock signal by inverting the buffered system clock signal;

a delay circuit coupled to the first inverter circuit and the first inverter for generating a delay signal by delaying the first inverter circuit clock signal;

a second inverter circuit coupled to the delay circuit and the third inverter for generating a second inverter circuit clock signal by inverting the delay signal;

a latch coupled to the first and second inverter circuits for latching the second inverter circuit clock signal;

a fourth inverter coupled to the latch for generating the first disable signal, the first disable signal driving a first transistor thereby providing a first power supply to the first node; and a fifth inverter coupled to the fourth inverter for generating the second disable signal, the second disable signal driving a second transistor thereby providing a second power supply to the second node and generating a second transition of the internal clock signal.

* * * * *